(12) United States Patent
Linney et al.

(10) Patent No.: US 10,581,485 B2
(45) Date of Patent: Mar. 3, 2020

(54) NEAR-END CROSSTALK CANCELLATION

(71) Applicant: GENESIS TECHNICAL SYSTEMS CORP., Calgary (CA)

(72) Inventors: David W Linney, Coventry (GB); Stephen Peter Cooke, Langdon (CA); Peter Khoury, London (GB)

(73) Assignee: GENESIS TECHNICAL SYSTEMS CORP., Calgary (CA)

( * ) Notice: Subject to any disclaimer, the term of this patent is extended or adjusted under 35 U.S.C. 154(b) by 0 days.

(21) Appl. No.: 16/098,722

(22) PCT Filed: May 5, 2017

(86) PCT No.: PCT/CA2017/050550
§ 371 (c)(1),
(2) Date: Nov. 2, 2018

(87) PCT Pub. No.: WO2017/190252
PCT Pub. Date: Nov. 9, 2017

(65) Prior Publication Data
US 2019/0123781 A1    Apr. 25, 2019

Related U.S. Application Data

(60) Provisional application No. 62/332,580, filed on May 6, 2016.

(51) Int. Cl.
*H01R 24/64* (2011.01)
*H04B 3/32* (2006.01)
(Continued)

(52) U.S. Cl.
CPC .............. *H04B 3/32* (2013.01); *H04L 25/08* (2013.01); *H04M 11/062* (2013.01); *H01R 24/64* (2013.01)

(58) Field of Classification Search
USPC .................................. 375/220, 222; 370/201
See application file for complete search history.

(56) References Cited

U.S. PATENT DOCUMENTS

| | | | |
|---|---|---|---|
| 6,934,387 B1 * | 8/2005 | Kim ..................... | H04B 3/23 379/406.01 |
| 7,593,458 B2 * | 9/2009 | Cioffi ..................... | H04B 3/32 375/222 |

(Continued)

OTHER PUBLICATIONS

International Search Report for International Patent Application No. PCT/CA2017/050550, dated Sep. 8, 2017 (2 pages).
(Continued)

*Primary Examiner* — Eva Y Puente
(74) *Attorney, Agent, or Firm* — Clark & Elbing LLP

(57) ABSTRACT

The present disclosure relates to near-end crosstalk (NEXT) cancellation. A transmit communication signal is transmitted over a first Digital Subscriber Line (DSL) connection using a first group of frequencies and a receive communication signal is received over a second DSL connection using a second group of frequencies that at least partially overlaps the first group of frequencies. A crosstalk correlation between the first and second communication signals is determined. Based on the crosstalk correlation, a crosstalk cancellation signal is generated. The crosstalk cancellation signal is subtracted from the second communication signal, with the intention of reducing NEXT.

14 Claims, 6 Drawing Sheets

(51) Int. Cl.
*H04L 25/08* (2006.01)
*H04M 11/06* (2006.01)

(56) References Cited

U.S. PATENT DOCUMENTS

| | | | |
|---|---|---|---|
| 8,045,446 B2* | 10/2011 | Fang | H04B 3/32 |
| | | | 370/201 |
| 8,509,050 B2* | 8/2013 | Hobbel | G01R 31/31708 |
| | | | 370/201 |
| 2005/0074055 A1 | 4/2005 | Takatori et al. | |
| 2005/0195892 A1 | 9/2005 | Ginis et al. | |
| 2007/0014378 A1 | 1/2007 | Parhi et al. | |
| 2010/0260245 A1* | 10/2010 | Parhi | H04L 25/03038 |
| | | | 375/220 |
| 2015/0009793 A1 | 1/2015 | Schwager et al. | |

OTHER PUBLICATIONS

Extended European Search Report for European Patent Application No. 17792343.0, dated Oct. 17, 2019 (7 pages).

\* cited by examiner

NEAR-END CROSSTALK CANCELLATION

CROSS-REFERENCE TO RELATED APPLICATIONS

This application is a National Phase application of, and claims the benefit of, International (PCT) Application Serial No. PCT/CA2017/050550, filed on May 5, 2017, which claims priority to U.S. Patent Application Ser. No. 62/332,580, entitled "NEAR-END CROSSTALK CANCELLATION", and filed on May 6, 2016, the entire contents of which are incorporated herein by reference.

FIELD

The present disclosure relates generally to communications and, in particular, to crosstalk cancellation.

BACKGROUND

Digital Subscriber Line (DSL) technologies such as Very high bit rate DSL (VDSL & VDSL Version 2—VDSL2) rely on isolation between transmit and receive signals by means of Frequency Division Multiplexing. All transmitting modems use specific frequency bands, and all receiving modems, which are physically in the same chip, use different frequency bands. This ensures that co-located equipment does not suffer Near-End Crosstalk (NEXT). These frequency bands (groups of frequency carriers that transmit in the same direction) are referred to as a Band-Plan, with several transmit bands interlaced with receive frequency bands, for example. However, this type of Band-Plan might not be suitable for all communication network deployments.

SUMMARY

According to an aspect of the present disclosure, a communication device includes a transmitter to transmit a first communication signal over a first DSL connection using a first group of frequencies, a receiver to receive a second communication signal over a second DSL connection using a second group of frequencies that at least partially overlaps the first group of frequencies, and a NEXT canceller. The NEXT canceller is coupled to the transmitter and to the receiver, to determine a crosstalk correlation between the first communication signal and the second communication signal, to generate a crosstalk cancellation signal based on the crosstalk correlation, and to subtract the crosstalk cancellation signal from the second communication signal.

The first group of frequencies and the second group of frequencies could fully overlap.

In an embodiment, the NEXT canceller is configured to determine the crosstalk correlation through a continuous auto-correlation between the first communication signal and the second communication signal.

The following is an example of a continuous auto-correlation:

$$\int_{-\infty}^{t} f_{A(t)} {}^{*} f_{B(t)} dt,$$

wherein $f_{A(t)}$ and $f_{B(t)}$ are the first communication signal and the second communication signal, respectively.

The NEXT canceller could include an Infinite Impulse Response (IIR) filter to generate the crosstalk cancellation signal by filtering the first communication signal, and a filter coefficient generator coupled to the IIR filter to generate filter coefficients for the IIR filter based on the crosstalk correlation.

The NEXT canceller could be configured to generate the filter coefficients IIR(n) in accordance with $$IIR(n) = f_{A(t+nT)} \otimes f_{B(t)},$$

wherein $f_{A(t+nT)}$ is the first communication signal delayed by nT, $f_{B(t)}$ is the second communication signal, T is a sample period of $f_{A(t)}$ and $f_{B(t)}$, and $\otimes$ is a correlation integral.

The NEXT canceller could include time delay elements to apply respective time delays to the first communication signal, a memory coupled to the time delay elements to store time delayed versions of the first communication signal, a coefficient generator to generate frequency-dependent crosstalk coefficients, and multipliers coupled to the memory and to the coefficient generator to apply the frequency-dependent crosstalk coefficients to the time delayed versions of the first communication signal to generate the crosstalk cancellation signal.

In an embodiment, the NEXT canceller includes a coefficient generator to generate respective sets of crosstalk coefficients corresponding to different relative phase alignments between the first communication signal and the second communication signal, a memory coupled to the coefficient generator to store the crosstalk coefficients, and multipliers coupled to the memory to apply a set of the crosstalk coefficients to the first communication signal based on a current phase alignment between the first communication signal and the second communication signal, to generate the crosstalk cancellation signal.

Time Division Multiplexing (TDM) could be applied to communications over the first and second DSL connections, and first and second far-end communication devices respectively coupled to the first and second DSL connections could be different distances from the communication device.

A communication device could also include: a first transceiver comprising the transmitter and a second receiver to receive a third communication signal over the first DSL connection using a third group of frequencies; and a second transceiver comprising the receiver and a second transmitter to transmit a fourth communication signal over the second DSL connection using a fourth group of frequencies that at least partially overlaps the third group of frequencies. The NEXT canceller could be coupled to the first transceiver and to the second transceiver, and be further configured to determine a second crosstalk correlation between the fourth communication signal and the third communication signal, to generate a second crosstalk cancellation signal based on the second crosstalk correlation, and to subtract the second crosstalk cancellation signal from the third communication signal.

The NEXT canceller could include a first NEXT canceller coupled to the first transceiver and a second NEXT canceller coupled to the second transceiver.

The crosstalk correlation could include a correlation between a further interfering signal and the second communication signal.

Another aspect of the present disclosure provides a method that involves determining a crosstalk correlation between a first communication signal that is transmitted over a first DSL connection using a first group of frequencies and a second communication signal that is received over a second DSL connection using a second group of frequencies that at least partially overlaps the first group of frequencies. The method also includes generating a crosstalk cancellation signal based on the crosstalk correlation, and subtracting the crosstalk cancellation signal from the second communication signal.

As noted above, the first group of frequencies and the second group of frequencies could fully overlap.

Determining the crosstalk correlation could involve determining the crosstalk correlation through a continuous auto-correlation between the first communication signal and the second communication signal.

The above example of a continuous auto-correlation $$\int_{-\infty}^{t} f_{A(t)} * f_{B(t)} dt,$$

could be used in such a method.

Generating the crosstalk cancellation signal could involve generating filter coefficients for IIR filtering based on the crosstalk correlation, and IIR filtering the first communication signal to generate the crosstalk cancellation signal.

In an embodiment, generating the filter coefficients involves generating the filter coefficients IIR(n) in accordance with $$IIR(n) = f_{A(t+nT)} \otimes f_{B(t)},$$

as noted above.

Determining the crosstalk correlation could involve applying respective time delays to the first communication signal, storing time delayed versions of the first communication signal in a memory, and generating frequency-dependent crosstalk coefficients. Generating the crosstalk cancellation signal could then involve applying the frequency-dependent crosstalk coefficients to the time delayed versions of the first communication signal to generate the crosstalk cancellation signal.

In an embodiment, determining the crosstalk correlation involves generating respective sets of crosstalk coefficients corresponding to different relative phase alignments between the first communication signal and the second communication signal, and storing the crosstalk coefficients to a memory, and generating the crosstalk cancellation signal involves applying a set of the crosstalk coefficients to the first communication signal based on a current phase alignment between the first communication signal and the second communication signal, to generate the crosstalk cancellation signal.

Such a method could be performed at a near-end communication device coupled to the first and second DSL connections. TDM could be applied to communications over the first and second DSL connections, and first and second far-end communication devices respectively coupled to the first and second DSL connections could be different distances from the near-end communication device.

A method could also involve: determining a second crosstalk correlation between a third communication signal that is received over the first DSL connection using a third group of frequencies and a fourth communication signal that is transmitted over the second DSL connection using a fourth group of frequencies that at least partially overlaps the third group of frequencies; generating a second crosstalk cancellation signal based on the second crosstalk correlation; and subtracting the second crosstalk cancellation signal from the third communication signal to cancel crosstalk from the third communication signal.

In some embodiments, the crosstalk correlation includes a correlation between a further interfering signal and the second communication signal.

A non-transitory processor-readable medium could be used to store instructions which, when executed by one or more processors, cause the one or more processors to perform a method disclosed herein.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION

Figure 1:
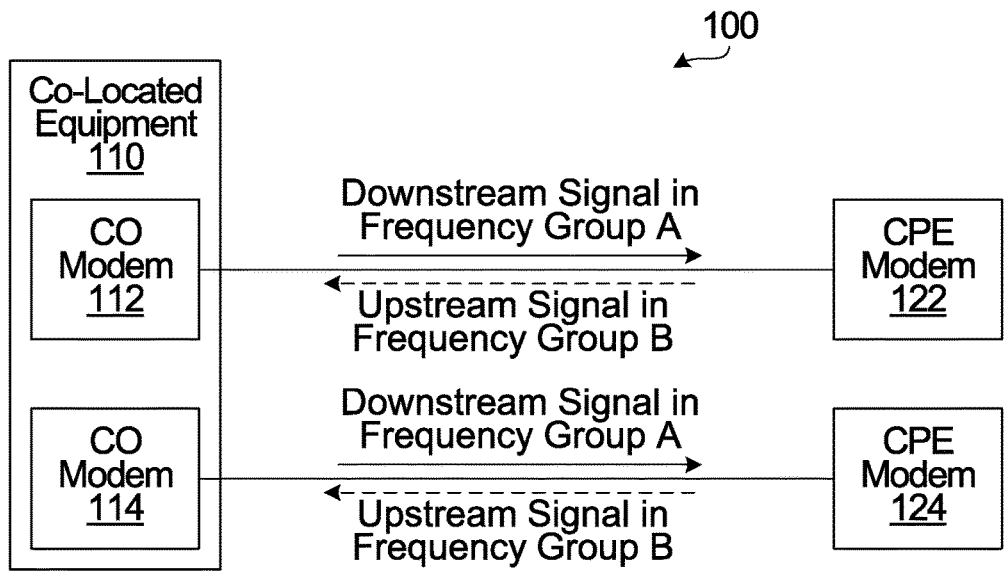
FIG. 1 is a block diagram of a typical point-to-point VDSL installation.

FIG. 1 is a block diagram of a typical point-to-point VDSL installation 100. In such a typical point-to-point VDSL installation, all co-located Central Office/Optical Node (CO) equipment 110, including CO modems 112, 114, uses the same CO-CPE Band-Plan. All remote Customer Premises Equipment (CPE), including CPE modems 122, 124, uses an inverse CPE-CO Band-Plan (transmit versus receive frequency band allocations). This Band-Plan arrangement is intended to avoid NEXT.

An alternative network topology is a ring. In a ring, spatial separation of the CO and CPE modems as shown in FIG. 1 might not be practical. Each node in a ring network deployment could be CO-equivalent or compatible in one direction and CPE-equivalent or compatible in another direction. A Band-Plan arrangement as shown in FIG. 1 would not avoid NEXT in such a ring network deployment, because each node implements both the CO-CPE Band-Plan and the CPE-CO Band-Plan.

Figure 2A:
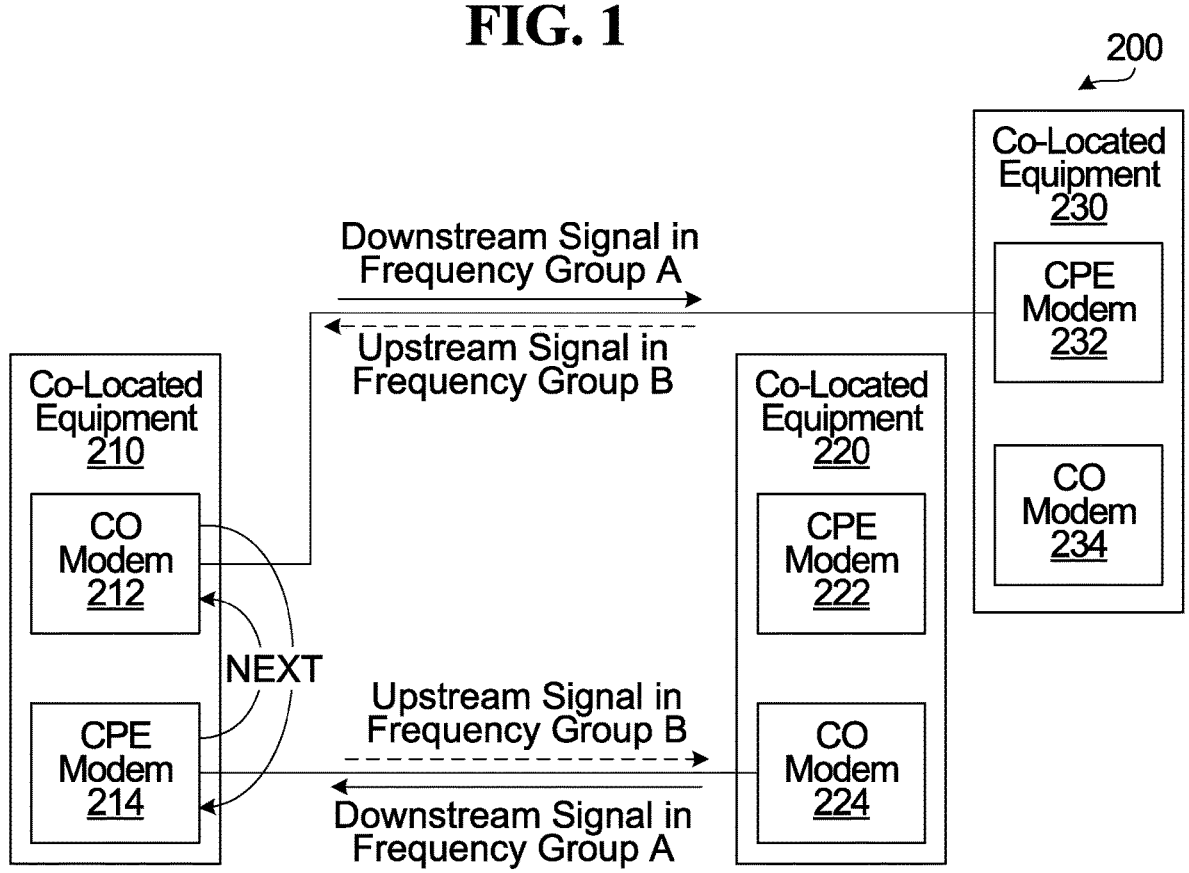
FIG. 2A is a block diagram of a communication network in which network nodes include co-located CO/CPE modems.

FIG. 2A is a block diagram of a communication network 200 in which network nodes include co-located CO/CPE modems, for example in an xDSL repeater. Co-located equipment at network node 210 includes a CO modem 212 and a CPE modem 214, at network node 220 includes a CO modem 224 and a CPE modem 222, and at network node 230 includes a CO modem 234 and a CPE modem 232. Although only three network nodes 210, 220, 230 are shown in FIG. 2A, a network may include additional nodes. The CPE modem 222 and/or the CO modem 234 could be connected to counterpart CO/CPE modems in other nodes, for example.

Figure 2B:
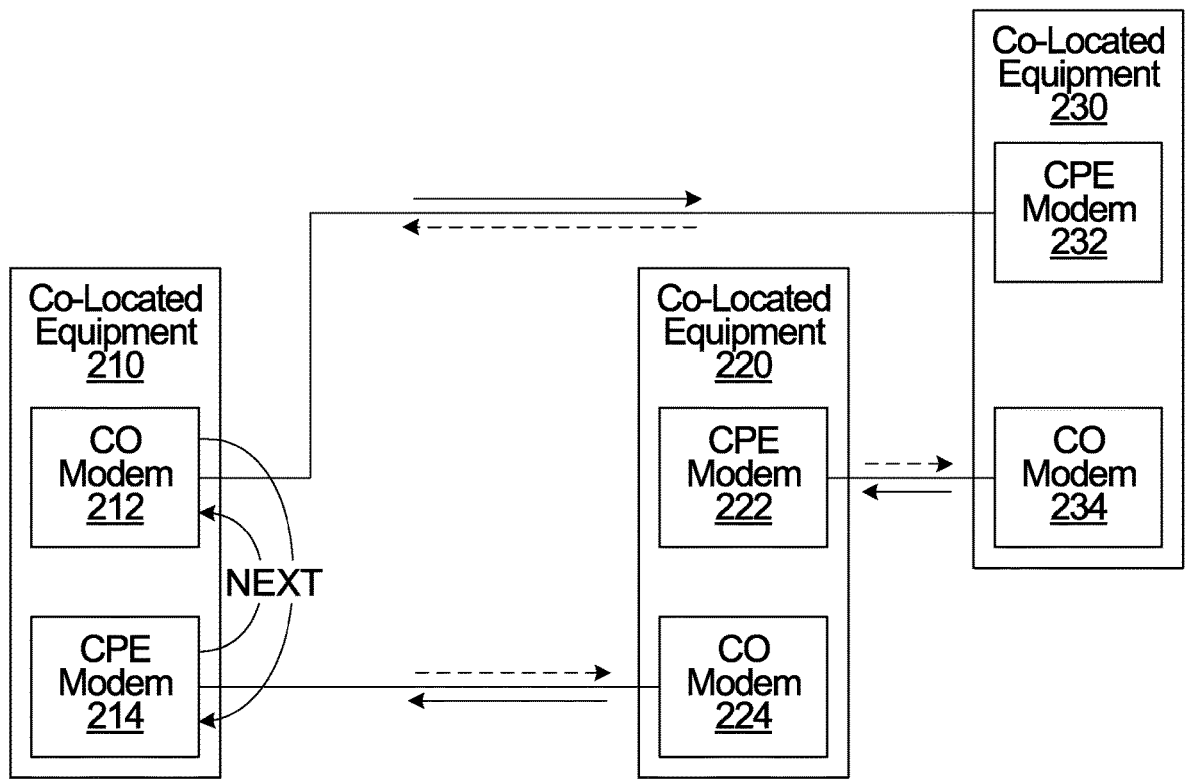
FIGS. 2B and 2C are block diagrams of other communication networks in which network nodes include co-located CO/CPE modems.

FIG. 2B is a block diagram of another communication network in which network nodes include co-located CO/CPE modems, and represents an example of a ring topology. The CO modem 234 communicates with the CPE modem 222 in this example. To avoid congestion in the drawing, Band-Plans are illustrated in FIG. 2B using the same line types as in FIG. 2A, but without text labels. A larger ring could include more than the three network nodes, with co-located CO/CPE modems at each network node communicating with counterpart CPE/CO modems at other nodes in the ring.

A ring is an example of a network implementation in which communications in overlapping frequency bands could result in NEXT, at the network node 210 as shown in FIGS. 2A and 2B, for example. It should be appreciated, however, that CO and CPE modems could potentially be co-located in other topologies, and NEXT cancellation as disclosed herein could be applied in any topologies in which NEXT could arise.

Figure 3:
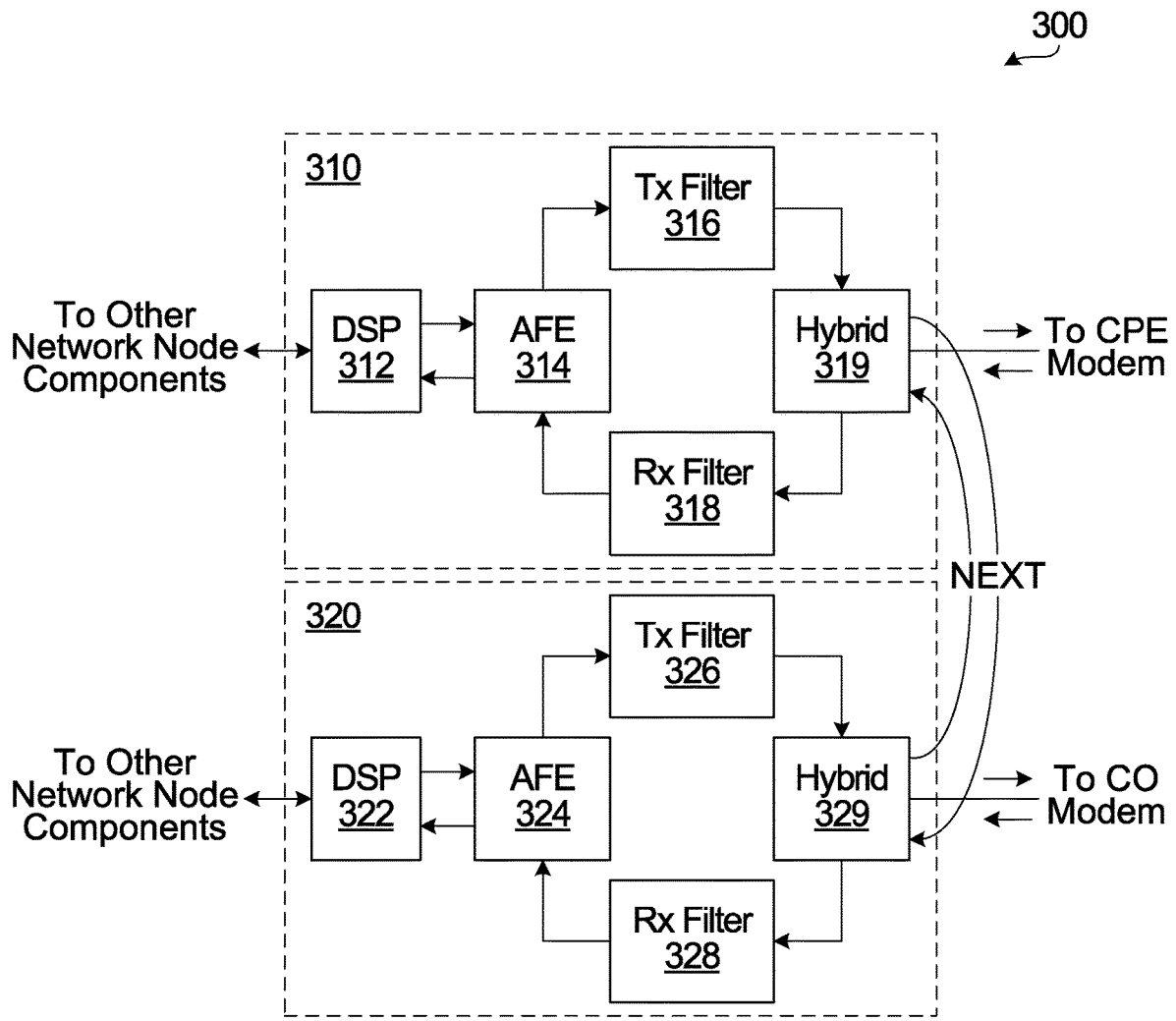
FIG. 3 is a block diagram illustrating a co-located CO/CPE modem.
Figure 4:
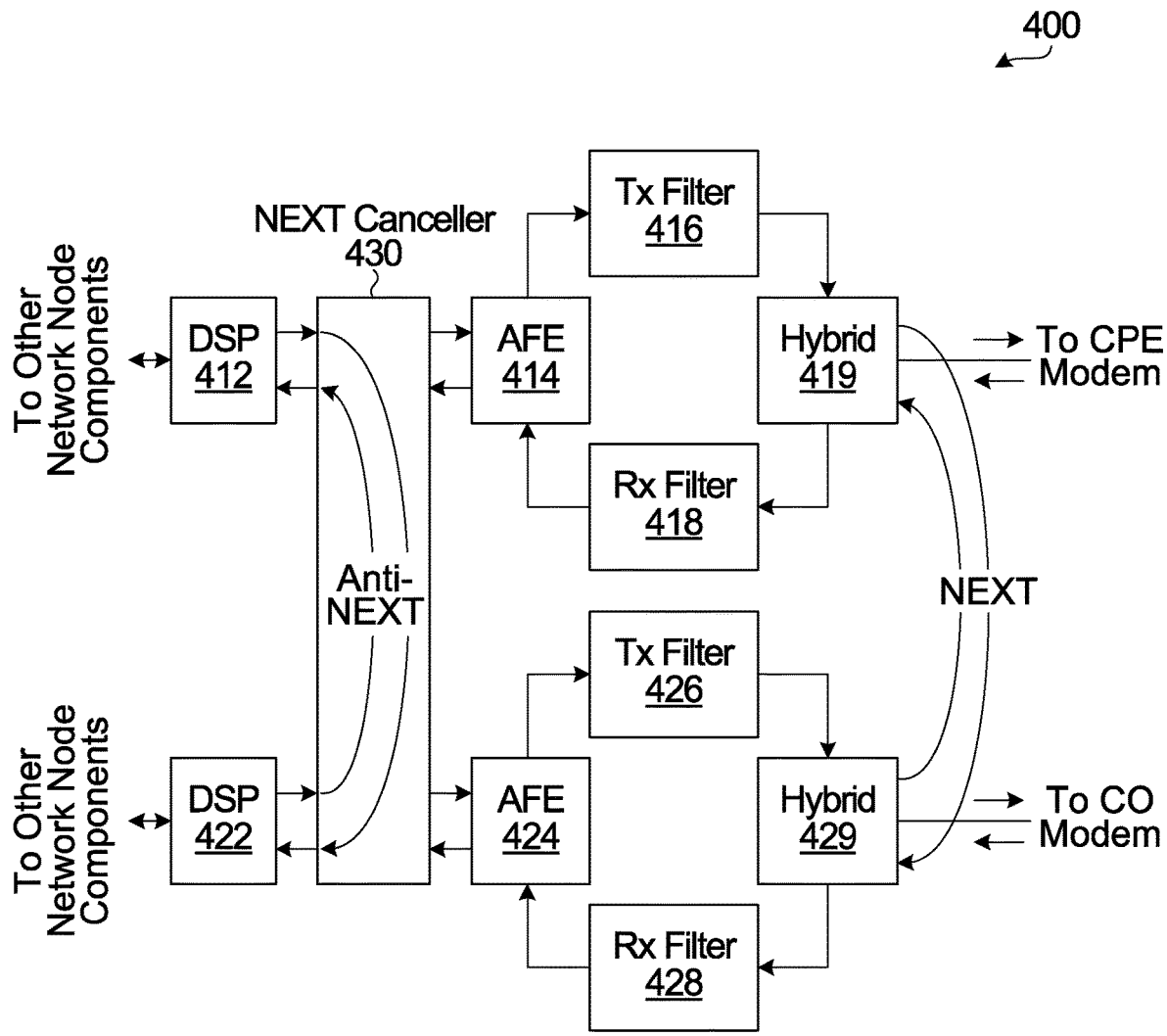
FIG. 4 is a block diagram illustrating a co-located CO/CPE modem with a NEXT canceller according to an embodiment.

The CO modems 212, 224, 234 and the CPE modems 214, 222, 232 could be implemented as separate modems or integrated into combined CO/CPE modems. Example CO/CPE modems are shown in FIGS. 3 and 4 and described below. Network connections between the modems at the network nodes 210, 220, 230 are by means of DSL connections over twisted wire pairs.

In FIGS. 2A and 2B, communications in one direction use a CO-CPE Band-Plan, and communications in the other direction use the CPE-CO Band-Plan. However, with co-location of the CO and CPE modems as shown, NEXT can arise between transmit and receive signals.

According to each Band-Plan as shown in FIGS. 2A and 2B, when a signal is transmitted in a frequency band, it is received in the same frequency band. Downstream signals transmitted from a CO modem to CPE modem in frequency group A are received by the CPE modem in that same frequency band. A CPE modem transmits towards a CO modem in a different frequency group B in the examples shown, so that upstream signals do not interfere with transmitted downstream signals. In such Frequency Division Multiplexing (FDM), one direction of transmission is in one frequency band, and the other direction of transmission is in a different frequency band. Frequency bands are groups of carrier frequencies that carry signals in one direction. Each individual carrier frequency is modulated so that the receiver can ideally reconstruct the original, transmitted signal. Bidirectional communications involves transmission in both directions along a link.

FDM is one possible approach to using a single physical communication link for bidirectional communications. FDM uses different bands of frequencies as described above, and possibly a guard band between those bands so that the two directions of transmission do not interfere with each other. Time Division Multiplexing (TDM) is another approach, in which a transmitter transmits a signal including a burst of data, and a receiver receives that signal and then sends a burst back in the other direction. FDM and TDM could be combined, such that TDM occurs over a large group of frequencies, as in G.fast for example. It is also theoretically possible to apply TDM to FDM signals. Embodiments disclosed herein could have application in FDM, TDM, or combined FDM/TDM systems.

Figure 2C:
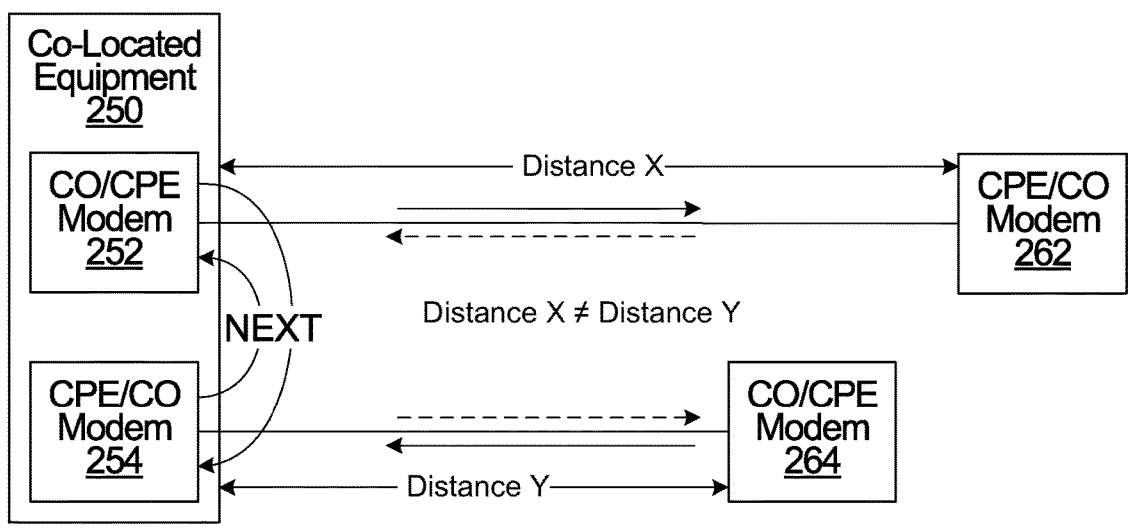

Although it might appear as though a TDM approach as outlined above might inherently avoid NEXT between two network nodes, a communication network could, and typically does, include more than two network nodes. Consider the example shown in FIG. 2C, and an implementation in which a network node 250 with co-located modems 252, 254 is at a CO and other network nodes, each with at least one modem 262, 264 are at different subscriber premises. The different subscriber premises could be customer's houses for example, and are different distances X and Y from the CO node 210. In an effort to avoid congestion in the drawing, only one modem 262, 264 at each subscriber premises is shown in FIG. 2C, but each subscriber premises could include co-located CO and CPE modems as shown in FIGS. 2A and 2B. One of the modems 252, 254 is a CO modem and the other is a CPE modem, and similarly the modems 262, 264 are corresponding CO or CPE modems. For example, the modem 252 could be a CO modem, in which case the modems 254, 262 are CPE modems and the modem 264 is a CO modem. The "CO/CPE Modem" and "CPE/CO Modem" labels in FIG. 2C are simply intended to encompass other embodiments.

Applying TDM between the CO node 250 and each subscriber premises modem 262, 264 could ideally avoid NEXT at the CO node. However, due to the different distances X and Y between the CO node 210 and each subscriber premises modem 262, 264, communications between the CO node 210 and any one of the subscriber premises modems 262, 264 could potentially interfere with communications between the CO node and the other subscriber premises node. Even though each subscriber premises modem 262, 264 might not transmit to the CO node 210 until a certain time delay after receiving a signal from the CO node 210, for example, signals that are being transferred in different directions between the CO node and the subscriber premises modems could still overlap in time or "pass" each other and thereby interfere with each other. This potential interference may arise, for example, due to the different distances and thus different transmission times between the CO node 210 and the subscriber premises modems 262, 264, and/or different clock timing at the CO node and one or both of the subscriber premises modems. For example, transmit and receive clocks might not be phase aligned and/or could drift past each other, causing crosstalk from one transmit symbol that affects one or more receive symbols. NEXT resulting from such effects is also contemplated herein for NEXT cancellation.

FIG. 3 is a block diagram illustrating a current structure of a co-located CO/CPE modem 300. The example modem 300 is a VDSL modem that includes a CO-compatible module 310 and a CPE-compatible module 320. Each of the CO-compatible module 310 and the CPE-compatible module 320 includes digital circuitry shown by way of example as Digital Signal Processors (DSPs) 312, 322, and analog circuitry. The analog circuitry includes an Analog Front End (AFE) 314, 324, transmit (Tx) and receive (Rx) filters 316/318, 326/328 respectively, and hybrid circuits 319, 329.

The digital circuitry could be implemented using other types of circuitry, in addition to or instead of the DSPs 312, 322. In general, hardware, firmware, components which execute software, or some combination thereof might be used in implementing the digital circuitry. Electronic devices that might be suitable for implementing any or all of these components include, among others, microprocessors, microcontrollers, Programmable Logic Devices (PLDs), Field Programmable Gate Arrays (FPGAs), Application Specific Integrated Circuits (ASICs), and other types of "intelligent" integrated circuits.

Those skilled in the art will be familiar with various examples of components that could be used in implementing the analog circuitry.

The DSPs 312, 322 in this example perform digital processing of transmit signals that are to be transmitted from the modem 300 and receive signals that are received by the modem. The transmit and receive signals are exchanged with other network node components. The specific type(s) of such network node components which generate the transmit signals or use the receive signals will be implementation-specific.

The AFEs 314, 324 convert digital transmit waveforms supplied by the DSPs 312, 322 into analog waveforms for transmission to the line, and also convert analog receive waveforms from the line into digital waveforms for the DSPs. The filters 316/318, 326/328 filter analog signals, and the hybrid circuits 319, 329 provide interfaces to the line. All of these elements, and various possible implementations, will be familiar to those skilled in the art.

FIG. 3 also illustrates where NEXT may affect performance of the modem 300.

Embodiments of the present disclosure relate to NEXT cancellation. In one embodiment, a DSP-based cancellation technique is used to cancel interference arising from NEXT. Although the present disclosure refers to NEXT "cancellation", it should be appreciated that NEXT might not be cancelled entirely. Cancellation is intended to convey the notion of reducing NEXT, and therefore cancellation encompasses partial cancellation, and not necessarily full elimination of NEXT.

FIG. 4 is a block diagram illustrating a co-located CO/CPE modem 400 with a NEXT canceller 430, and shows where the NEXT canceller is situated in one embodiment in order to cancel NEXT.

Many of the components of the example modem 400 could be implemented in the same way as in the example modem 300. For example, digital circuitry in the example modem 400 could be implemented in DSPs 412, 422 as in FIG. 3, or otherwise as described above with reference to FIG. 3. The analog circuitry in the modem 400 could similarly include AFEs 414, 424, Tx and Rx filters 416/418, 426/428 respectively, and hybrid circuits 419, 429 as in FIG. 3. All of these components could also operate in the same way as in FIG. 3. The NEXT canceller 430 is coupled between the DSPs 412, 422 and the AFEs 414, 424 so that it can subtract transmit crosstalk from receive waveforms, but might not otherwise impact operation of the other components of the example modem 400.

Figure 5:
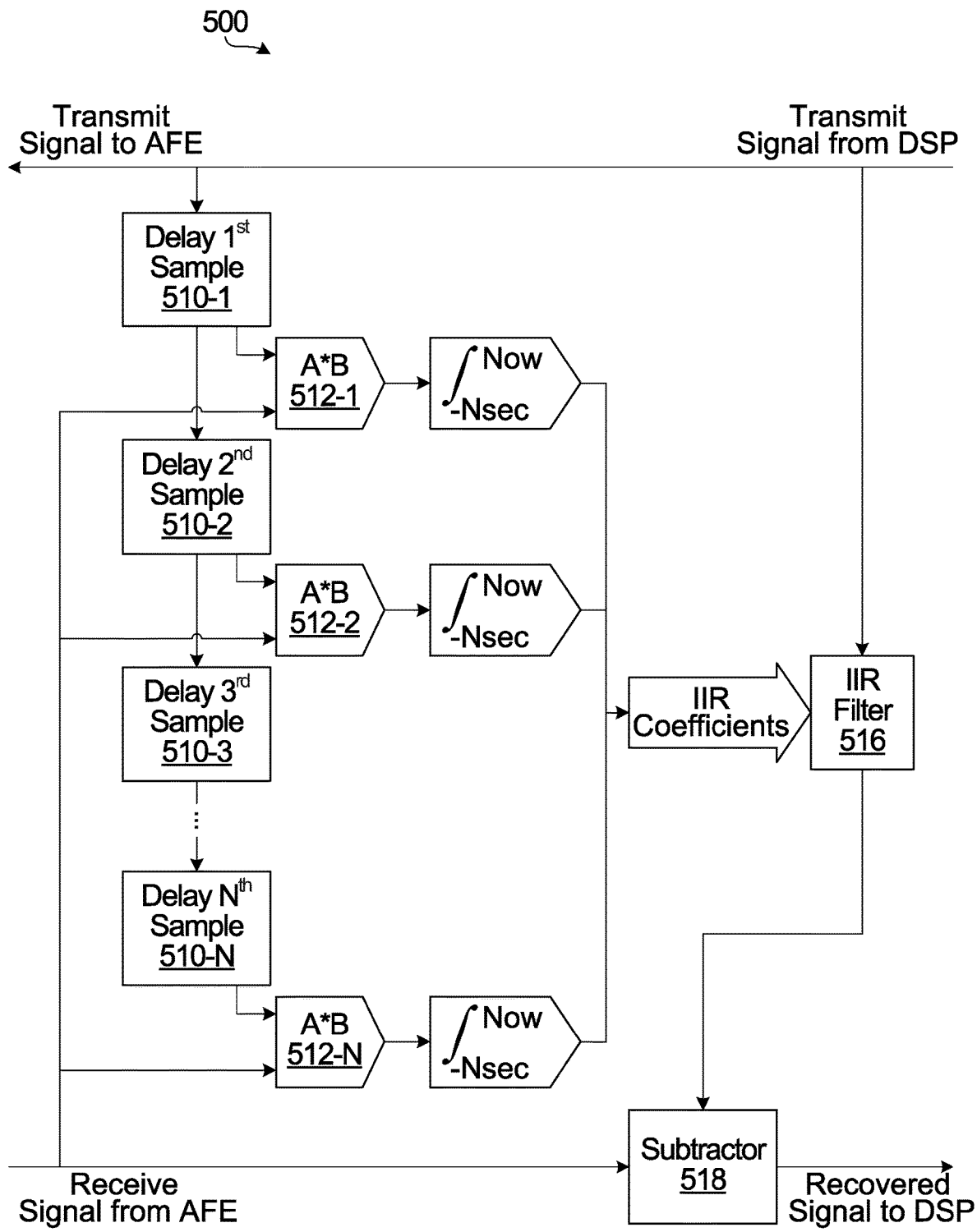
FIG. 5 is a block diagram illustrating an embodiment of a NEXT canceller.

The NEXT canceller 430, like other digital circuitry in the example modem 400, could be implemented using hardware, firmware, components which execute software, or some combination thereof. An example of a NEXT canceller is shown in FIG. 5 and described in detail below. Also, although shown as a separate element in FIG. 4, the NEXT canceller 430 could be integrated with one or more other components, such as the DSPs 412, 422 and/or other digital circuitry.

In an embodiment, the characteristics of the NEXT are learned by means of continuous auto-correlation. This is a process whereby the amount of one signal, that is contained in another signal, can be determined. The two signals are continuously multiplied together and the product is integrated. If there is no correlation between the two signals, then the integral will tend toward zero. If there is a correlation, then the integral will arrive at a value related to the proportion of Signal A that is contained within Signal B.

The following is an example of a continuous auto-correlation that could be used to derive a coefficient:

$$C_{corr} = \int_{-\infty}^{t} f_{A(t)} * f_{B(t)} dt$$

denoted as $$C_{corr} = f_{A(t)} \otimes f_{B(t)}$$

where
$f_{A(t)}$ is the near-end transmit waveform
$f_{B(t)}$ is the receive waveform, which may include crosstalk
$\otimes$ is the Correlation Integral
$C_{corr}$ is a coefficient derived from the Correlation Integral.

If there is little correlation between the content in different phases of Signal A, then this technique can be used to determine how much of Signal A can be found in Signal B at various positions in time. If this technique is applied to each of a number of delay values that might be expected to contain significant crosstalk for example, then a waveform characterizing a NEXT transfer function can be derived.

In an embodiment, this procedure applied at multiple delay values produces coefficients for a filter. An Infinite Impulse Response (IIR) filter implementation of a NEXT transfer function, for example, could use the following filter coefficients:

$$IIR(n) = f_{A(t+nT)} \otimes f_{B(t)}$$

where
IIR(n) are the IIR coefficients
$f_{A(t+nT)}$ is the near-end transmit waveform $f_{A(t)}$, delayed by nT
$f_{B(t)}$ is the receive waveform, which may include crosstalk
T is the sample period of the digital waveforms $f_{A(t)}$ and $f_{B(t)}$
$\otimes$ is the Correlation Integral.

The expected NEXT signal, also referred to herein as a crosstalk cancellation signal, is derived in this embodiment by passing the near-end transmit waveform through an IIR filter using the derived coefficients. The expected NEXT signal is then subtracted from the receive waveform to ideally recover the original waveform that was transmitted by a far-end transmitter, or in practical terms to reduce the effect of crosstalk on the far-end transmit waveform and recover a receive waveform that is closer to the original far-end transmit waveform. Other implementations, using other types of filters, for example, are also possible.

FIG. 5 is a block diagram illustrating an embodiment of a NEXT canceller 500. The example NEXT canceller 500 includes N delay elements 510-1 to 510-N, which apply successive delays of one sample period to a transmit signal. N could be determined, for example, based on signal delay on a transmit and/or receive path, between a modem's transceiver and other components of a network node. In an embodiment, N is based on the signal delay or distance between the modem and a relay card in the network node. N could also or instead be a function of one or more other parameters, such as available resources in an FPGA/ASIC or space in a memory to store samples, an amount of tolerable delay through the NEXT canceller, an amount of processing power available for the NEXT canceller, the degree of overlap between transmit and receive frequency bands, etc.

For each delayed version of the transmit signal, representing potentially different timing or phase alignments between a received signal and a near-end transmitted signal, a respective one of N correlators determines a correlation between the delayed transmit signal and a receive signal. Each correlator includes a multiplier 512-1 to 512-N and an integrator 514-1 to 514-N. The correlators are an example of a filter coefficient generator. The resulting IIR filter coefficients are provided to an IIR filter 516, and the filtered transmit signal is subtracted from the receive signal by a subtractor 518.

Various implementations of the components shown in FIG. 5 are possible, and those skilled in the art will be familiar with examples of delay elements, multipliers, integrators, IIR filters, and subtractors that could be used to implement the components shown in FIG. 5.

In another embodiment, a NEXT canceller includes time delay elements such as 510-1 to 510-N, to apply respective time delays to the transmit signal. A memory, which could include one or more memory devices, is coupled to the time delay elements to store time delayed versions of the transmit signal. A coefficient generator generates frequency-dependent crosstalk coefficients based on correlation between each delayed transmit signal and the receive signal, and multipliers are coupled to the memory and to the coefficient generator to apply the frequency-dependent crosstalk coefficients to the time delayed versions of the transmit signal, to thereby generate a crosstalk cancellation signal. In this embodiment, there could be two sets of multipliers, including the multipliers shown 512-1 to 512-N as part of a coefficient generator and separate multipliers to apply generated coefficients to the time delayed versions of the transmit signal, or one set of multipliers could be used at different times for coefficient generation and application of coefficients to the time delayed versions of the transmit signal. Different time delays could be applicable, for example, in a scenario in which transmit and receive clocks are not perfectly phase aligned and/or may drift past each other, causing crosstalk from one transmit symbol that affects one or more receive symbols.

According to another embodiment, a coefficient generator could generate respective sets of crosstalk coefficients corresponding to different relative phase alignments between a near-end transmit signal and a receive signal. These sets of coefficients could be stored in a memory. The memory could implement additional memory banks in addition to those that store, for example, delayed versions of the transmit signal. Multipliers coupled to the memory apply a set of the crosstalk coefficients to the transmit signal based on a current phase alignment between the transmit signal and the receive signal, to generate the crosstalk cancellation signal. Current phase alignment could be determined, for example, by recovering the receive clock from an incoming signal, using a Phase Locked Loop (PLL), Surface Acoustic Wave (SAW) device, or other clock recovery mechanism, and comparing relative phases of the recovered clock's edges with edges of the transmit clock. The coefficients for different time delays corresponding to different phase shifts could be pre-calculated using a training pattern or other calibration sequence, for example.

Different phase alignments or different phase relationships between near-end transmit signals and receive signals could arise, for example, even in implementations that apply TDM to communications over different DSL connections. Far-end communication devices coupled to those DSL connections could be at different distances from the near-end device, leading to different timing between the far-end devices. In this scenario, described above with reference to FIG. 2B by way of example, the transmit and receive signals overlap in the time domain, implying a phase relationship between the signals that are used in NEXT cancellation.

Various embodiments are described in detail above. More generally, a communication device such as a CO/CPE modem includes a transmitter to transmit a first communication signal over a first DSL connection using a first group of frequencies, and a receiver to receive a second communication signal (from a CO modem in FIG. 4, for example) over a second DSL connection using a second group of frequencies that at least partially overlaps the first group of frequencies. The first communication signal could be a signal that is transmitted to a CPE modem over the "top" DSL connection in FIG. 4, or a signal that is transmitted to a CO modem over the "bottom" DSL connection in FIG. 4, for example. Similarly, the second communication signal could be a signal that is received from a CPE modem over the "top" DSL connection in FIG. 4, or a signal that is received from a CO modem over the "bottom" DSL connection in FIG. 4. The first and second groups of frequencies could fully overlap as shown in FIG. 2, for example, or only partially overlap and include one or more common frequencies.

Such a communication device also includes a NEXT canceller, coupled to the transmitter and to the receiver. The NEXT canceller is configured to determine a crosstalk correlation between the first communication signal and the second communication signal. The crosstalk correlation could be determined through a continuous auto-correlation between the first communication signal and the second communication signal, and an example of such a correlation is provided above.

The NEXT canceller is also configured to generate a crosstalk cancellation signal based on the crosstalk correlation. In an embodiment described above, the NEXT canceller includes an IIR filter 516 (FIG. 5) to generate the crosstalk cancellation signal by filtering the first communication signal, and the NEXT canceller is configured to generate filter coefficients for the IIR filter based on the crosstalk correlation. An example approach for generating the IIR filter coefficients is provided above.

The NEXT canceller subtracts the crosstalk cancellation signal from the second communication signal.

The transmitter could be part of a first transceiver, such as a CO/CPE modem, that also includes a receiver to receive a third communication signal over the first DSL connection using a third group of frequencies. Similarly, the receiver that receives the second communication signal could be part of a second transceiver that also includes a second transmitter to transmit a fourth communication signal over the second DSL connection using a fourth group of frequencies that at least partially overlaps, and may fully overlap, the third group of frequencies. In an embodiment, the third group of frequencies is the same as the second group of frequencies, and the fourth group of frequencies is the same as the first group of frequencies, so that there are two groups of frequencies as shown in FIG. 3.

The NEXT canceller could be coupled to the first transceiver and to the second transceiver as shown in FIG. 4, for example, and be further configured to determine a second crosstalk correlation between the fourth communication signal and the third communication signal, to generate a second crosstalk cancellation signal based on the second crosstalk correlation, and to cancel crosstalk from the third communication signal by subtracting the second crosstalk cancellation signal from the third communication signal. The NEXT canceller in FIG. 5, for example, could be coupled to both DSPs 412, 422 and to both AFEs 414, 424 (FIG. 4), to cancel NEXT from signals that are received from a remote CPE modem or a remote CO modem. A NEXT canceller could instead include separate NEXT cancellation circuits such as the circuit shown in FIG. 5, to cancel NEXT from signals that are received on each of the two receive paths.

The embodiments described above relate to communication devices such as modems. Method embodiments are also contemplated.

Figure 6:
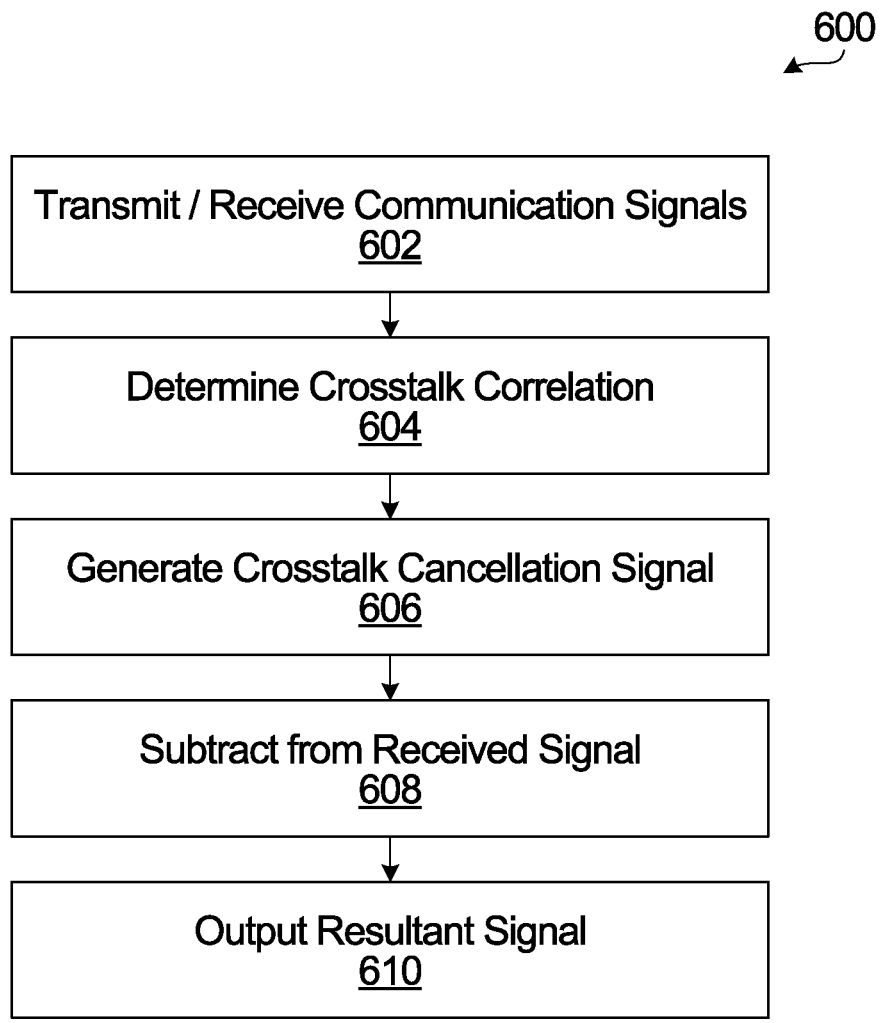
FIG. 6 is a flow diagram illustrating an example method according to an embodiment.

FIG. 6 is a flow diagram illustrating an example method 600. In the method 600, communication signals are transmitted and received at 602. A crosstalk correlation, between a first communication signal that is transmitted over a DSL connection using a first group of frequencies and a second communication signal that is received over a second DSL connection using a second group of frequencies that at least partially overlaps the first group of frequencies, is determined at 604. A crosstalk cancellation signal is generated at 606, based on the crosstalk correlation. The crosstalk cancellation signal is subtracted from the second communication signal at 608, and the resultant signal is output at 610, for further receiver processing for example.

The example method 600 is illustrative of one embodiment. Examples of additional operations that may be performed, and examples of how operations may be performed, will be apparent from the description and drawings relating to modems or implementations, for example. A method need not be performed only once as shown in FIG. 6, but could be repeated or ongoing as a continuous process. Further variations may be or become apparent.

What has been described is merely illustrative of the application of principles of embodiments of the present disclosure. Other arrangements and methods can be implemented by those skilled in the art.

For example, the examples in FIGS. 4 to 6 are intended solely for illustrative purposes. The present invention is in no way limited to the particular example embodiments explicitly shown in the drawings and described herein.

In some embodiments, a NEXT canceller could be operated in an initial training period during which it learns the characteristics of the NEXT that is to be cancelled. Next cancellation could then commence after the training period.

A NEXT canceller could potentially identify other interference sources or signals as well, and not only a transmit signal that is transmitted by co-located equipment. NEXT and other interference could then be cancelled. For example, there could be side contributions from known repetitive signals that have somewhat consistent correlations, and these could be taken into account as well in determining cancellation signals. For example, a crosstalk correlation could include a correlation between a further interfering signal, in addition to a transmit signal, and a receive signal from which NEXT is to be cancelled. Any interfering signal(s), from one or more interference source(s), could be consistent or predictable, or possibly detected, and included in determining a correlation with the receive signal. The signal $f_{A(t)}$ could include not only a transmit signal, but a combination of the transmit signal and one or more interfering signals, for example. A correlation contribution from the interfering signal(s) could also or instead be otherwise determined and included in the crosstalk correlation that is used in NEXT cancellation. In some embodiments, the interfering signal(s) could be time-varying, but consistent or predicable at least within the timeframe of NEXT cancellation coefficients. In this manner, interference arising from additional interfering signals and other sources of interference could also be cancelled.

In addition, although described primarily in the context of methods and systems, other implementations are also contemplated, as instructions stored on a non-transitory computer-readable medium, for example.

We claim:

1. A communication device comprising:
    a transmitter to transmit a first communication signal over a first Digital Subscriber Line (DSL) connection using a first group of frequencies;
    a receiver to receive a second communication signal over a second DSL connection using a second group of frequencies that at least partially overlaps the first group of frequencies;
    a Near-End Crosstalk (NEXT) canceller, coupled to the transmitter and to the receiver, to determine a crosstalk correlation between the first communication signal and the second communication signal, to generate a crosstalk cancellation signal based on the crosstalk correlation, and to subtract the crosstalk cancellation signal from the second communication signal,
    wherein the NEXT canceller comprises an Infinite Impulse Response (IIR) filter to generate the crosstalk cancellation signal by filtering the first communication signal, and a filter coefficient generator coupled to the IIR filter to generate filter coefficients for the IIR filter based on the crosstalk correlation.

2. The communication device of claim 1, wherein the NEXT canceller is configured to determine the crosstalk correlation through a continuous auto-correlation between the first communication signal and the second communication signal.

3. The communication device of claim 2, wherein the continuous auto-correlation comprises $$\int_{-\infty}^{t} f_{A(t)} * f_{B(t)} dt,$$

wherein $f_{A(t)}$ and $f_{B(t)}$ are the first communication signal and the second communication signal, respectively.

4. The communication device of claim 1, wherein the NEXT canceller is configured to generate the filter coefficients IIR(n) in accordance with $$IIR(n) = f_{A(t+nT)} \otimes f_{B(t)},$$

wherein $f_{A(t+nT)}$ is the first communication signal delayed by nT, $f_{b(t)}$ is the second communication signal, T is a sample period of $f_{A(t)}$ and $f_{B(t)}$, and $\otimes$ is a correlation integral.

5. The communication device of claim 1, comprising:
    a first transceiver comprising the transmitter and a second receiver to receive a third communication signal over the first DSL connection using a third group of frequencies;
    a second transceiver comprising the receiver and a second transmitter to transmit a fourth communication signal over the second DSL connection using a fourth group of frequencies that at least partially overlaps the third group of frequencies,
    wherein the NEXT canceller is coupled to the first transceiver and to the second transceiver, and is further configured to determine a second crosstalk correlation between the fourth communication signal and the third communication signal, to generate a second crosstalk cancellation signal based on the second crosstalk correlation, and to subtract the second crosstalk cancellation signal from the third communication signal.

6. The communication device of claim 5, wherein the NEXT canceller comprises a first NEXT canceller coupled to the first transceiver and a second NEXT canceller coupled to the second transceiver.

7. The communication device of claim 1, wherein the crosstalk correlation includes a correlation between a further interfering signal and the second communication signal.

8. A method comprising:
    determining a crosstalk correlation between a first communication signal that is transmitted over a first Digital Subscriber Line (DSL) connection using a first group of frequencies and a second communication signal that is received over a second DSL connection using a second group of frequencies that at least partially overlaps the first group of frequencies;
    generating a crosstalk cancellation signal based on the crosstalk correlation;
    subtracting the crosstalk cancellation signal from the second communication signal, wherein generating the crosstalk cancellation signal comprises:

generating filter coefficients for Infinite Impulse Response (IIR) filtering based on the crosstalk correlation;

IIR filtering the first communication signal to generate the crosstalk cancellation signal.

9. The method of claim 8, wherein determining the crosstalk correlation comprises determining the crosstalk correlation through a continuous auto-correlation between the first communication signal and the second communication signal.

10. The method of claim 9, wherein the continuous auto-correlation comprises $$\int_{-\infty}^{t} f_{A(t)} * f_{B(t)} dt,$$

wherein $f_{A(t)}$ and $f_{B(t)}$ are the first communication signal and the second communication signal, respectively.

11. The method of claim 8, wherein generating the filter coefficients comprises generating the filter coefficients IIR (n) in accordance with $$IIR(n) = f_{A(t+nT)} \otimes f_{B(t)},$$

wherein $f_{A(t+nT)}$ is the first communication signal delayed by nT, $f_{B(t)}$ is the second communication signal, T is a sample period of $f_{A(t)}$ and $f_{B(t)}$, and $\otimes$ is a correlation integral.

12. The method of claim 8, further comprising:

determining a second crosstalk correlation between a third communication signal that is received over the first DSL connection using a third group of frequencies and a fourth communication signal that is transmitted over the second DSL connection using a fourth group of frequencies that at least partially overlaps the third group of frequencies;

generating a second crosstalk cancellation signal based on the second crosstalk correlation;

subtracting the second crosstalk cancellation signal from the third communication signal to cancel crosstalk from the third communication signal.

13. The method of claim 8, wherein the crosstalk correlation includes a correlation between a further interfering signal and the second communication signal.

14. A non-transitory processor-readable medium storing instructions which, when executed by one or more processors, cause the one or more processors to perform the method of claim 8.

* * * * *